(12) United States Patent
Chiu et al.

(10) Patent No.: US 9,203,403 B2
(45) Date of Patent: Dec. 1, 2015

(54) TOUCH PANNEL

(71) Applicant: TPK TOUCH SOLUTIONS (XIAMEN) INC., Xiamen (CN)

(72) Inventors: Tsung-Ke Chiu, Tainan (TW); Yan Lin, Fuzhou (CN); Jing Yu, Xiamen (CN); Quanfu Xu, Guangzhou (CN)

(73) Assignee: TPK Touch Solutions (Xiamen) Inc., Xiamen (CN)

( * ) Notice: Subject to any disclaimer, the term of this patent is extended or adjusted under 35 U.S.C. 154(b) by 216 days.

(21) Appl. No.: 13/949,150

(22) Filed: Jul. 23, 2013

(65) Prior Publication Data

US 2014/0027264 A1 Jan. 30, 2014

(51) Int. Cl.
*G06F 3/044* (2006.01)
*H03K 17/96* (2006.01)

(52) U.S. Cl.
CPC .............. *H03K 17/962* (2013.01); *G06F 3/044* (2013.01); *G06F 2203/04111* (2013.01)

(58) Field of Classification Search
CPC .................................. G06F 3/041; G06F 3/044
See application file for complete search history.

(56) References Cited

U.S. PATENT DOCUMENTS

| | | | | |
|---|---|---|---|---|
| 2008/0264699 A1* | 10/2008 | Chang et al. | | 178/18.01 |
| 2008/0309635 A1* | 12/2008 | Matsuo | | 345/173 |
| 2011/0157086 A1* | 6/2011 | Ozeki et al. | | 345/174 |
| 2012/0081333 A1* | 4/2012 | Ozeki et al. | | 345/174 |
| 2014/0320761 A1* | 10/2014 | Misaki | | 349/12 |
| 2014/0333578 A1* | 11/2014 | Wu et al. | | 345/174 |
| 2014/0347319 A1* | 11/2014 | Lin et al. | | 345/174 |
| 2014/0347579 A1* | 11/2014 | Jang et al. | | 349/12 |
| 2014/0375904 A1* | 12/2014 | Lu | | 349/12 |
| 2015/0001060 A1* | 1/2015 | Kim et al. | | 200/600 |
| 2015/0077650 A1* | 3/2015 | Huang et al. | | 349/12 |
| 2015/0085204 A1* | 3/2015 | Lee | | 349/12 |

\* cited by examiner

*Primary Examiner* — Renee Luebke
*Assistant Examiner* — Ahmed Saeed
(74) *Attorney, Agent, or Firm* — Gokalp Bayramoglu

(57) ABSTRACT

The touch panel comprises a plurality of first axial electrodes extending along a first direction and a plurality of second axial electrodes extending along a second direction. The second axial electrode comprises a plurality of second axial conductive units and a plurality of bridging structures connecting with two adjacent second axial conductive units electrically. The bridging structure comprises a conductive component and an insulating component. The insulating component disposed between the conductive component and the first axial electrode. The conductive component comprises a connection portion and two contact portions, the two contact portions are respectively disposed on both ends of the insulating component and contact their corresponding second axial conductive units. The connection portion is electrically connected with the two contact portions, while the length of the connection portion along the first direction is less than the lengths of the contact portions along the first direction.

20 Claims, 6 Drawing Sheets

TOUCH PANNEL

BACKGROUND OF THE INVENTION

This application claims priority of China Patent Application No. 201210258116.6, filed on 2012 Jul. 24, the entirety of which is incorporated herein by reference.

FIELD OF THE INVENTION

The disclosure relates to an input interface, and more particularly to a touch panel.

DESCRIPTION OF THE RELATED ART

In recent years, touch panel has been widely used in many consumer electronic products. Currently, the touch technology has developed with diversification. Common applied technology in portable electronic devices includes resistive-type and capacitive-type with the operating principle of using inductive electrodes. The above technology can detect the variations of the electric signals in the touch position and utilizes the connection lines connected between the inductive electrodes located at different axes to execute a positioning operation by the feedback of the signals In the well-known technology of capacitive touch panel, multiple insulators can be used to isolate the inductive electrodes located at different directions for preventing signal interference. The connection lines (called as the bridging lines) are disposed across the insulators and electrically connect between two adjacent inductive electrodes along a same direction. FIG. 1 shows the schematic diagram of the touch panel. As shown in FIG. 1, the touch panel 100 includes a plurality of first-axial electrodes 121, a plurality of second-axial electrodes 122, and insulators 131. Each second-axial electrode 122 comprises a plurality of second-axial conductive units 123 and a plurality of bridging lines 141. The bridging line 141 and the insulator 131 are strip types. The width of the bridging line 141 is less than the width of the insulator 131. Two ends of the bridging line 141 connect with two adjacent second-axial conductive units 123 electrically. In such a condition, the contact area between the bridging line 141 and the second-axial conductive unit 123 is limited by the reason that the width of the bridging line 141 is less than the width of the insulator 131. A portion of the bridging line 141 near the edge of the insulator 131 is contaminated easily by the dirt on the edge of the insulator 131, and influences the quality of electrical connection. In addition, there will have an obvious influence in the quality of electrical connection and then make the signal of the touch panel unstable if the bridging line 141 has a fracture located near the edge of the insulator 131. Especially, the above influence will be more obvious when the bridging line 141 be thinner.

SUMMARY OF THE DISCLOSURE

The disclosure provides a touch panel with a bridging structure comprising two contact portions with wider breadth and a connection portion with relative narrow breadth, wherein the bridging structure connects with two adjacent second-axial conductive units electrically. In the disclosure, the contact area between the bridging structure and the second-axial conductive unit increases, and this reduces the influence described in prior art about the fracture of the bridging line. Then, the stability of the touch panel in signal is upgrade.

According to one preferred embodiment of the disclosure, the touch device comprises a plurality of first axial electrodes and second axial electrodes. The first axial electrodes extend along a first direction, whereas the second axial electrodes extend along a second direction. The second axial electrode comprises a plurality of second axial conductive units and at least a bridging structure connecting with two adjacent second axial conductive units electrically. The bridging structure comprises a conductive component and an insulating component. The insulating component is disposed between the conductive component and the first axial electrode to perform electrical insulation. The conductive component comprises at least one connection portion and two contact portions. The two contact portions are respectively disposed on both ends of the insulating component and contact with the corresponding second axial conductive units. The connection portion is connected with the two contact portions to make the two adjacent second axial conductive units have a electrical connection. In addition, the length of each contact portion along the first directional length is less than the length of the contact portion along the first direction.

BRIEF DESCRIPTION OF THE DRAWINGS

For those skilled in the art, numerous embodiments and drawings described below are for illustration purpose only, and not to limit the scope of the present disclosure in any manner.

DETAILED DESCRIPTION OF THE EMBODIMENTS

Certain words and phrases used in the description and claims refer to specific components. The same components exist in the pertained field comprehensible for ordinary learners and possibly called with different terms by manufactures. The following description and claims do not take such difference as a way of distinguishing components, but take the difference in component functions as the benchmark of distinguishing. Moreover, in order to make the ordinary technicians familiar with the technical field of the present disclosure, the following text particularly lists several favorable embodiments of the present disclosure with attached drawings and illustrates the constituent contents of the present disclosure in detail. It should be noted that the schemas are made only for the purpose of illustration, and not drawn in accordance with the original dimensions. In addition, the term such as "the first" and " the second" in the description and claims are used only for distinguishing different components but not for restricting their generation sequence.

Figure 1:
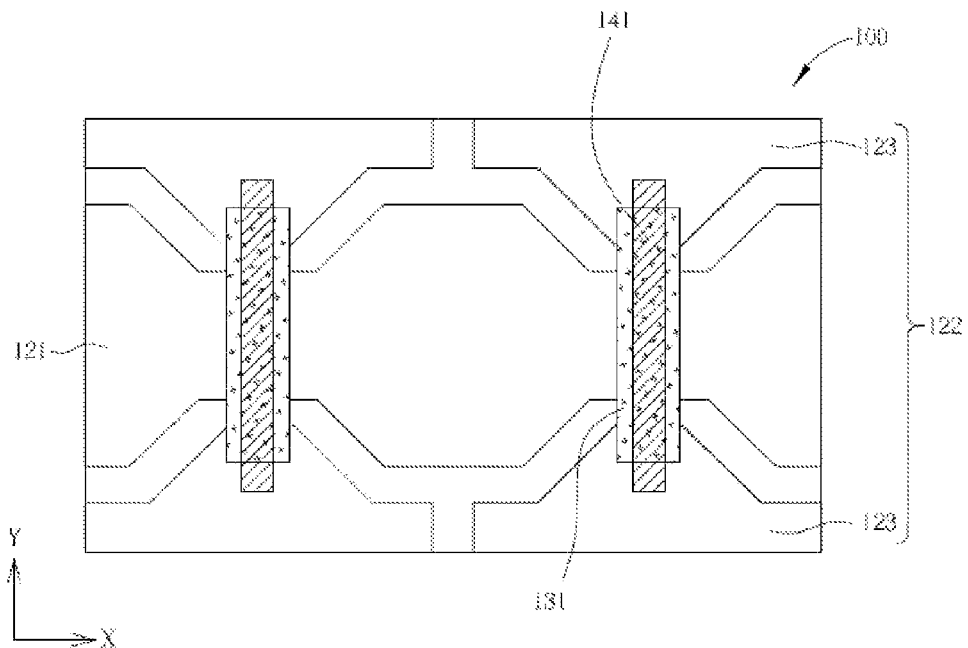
FIG. 1 shows the schematic diagram of the well-known touch panel.
Figure 2:
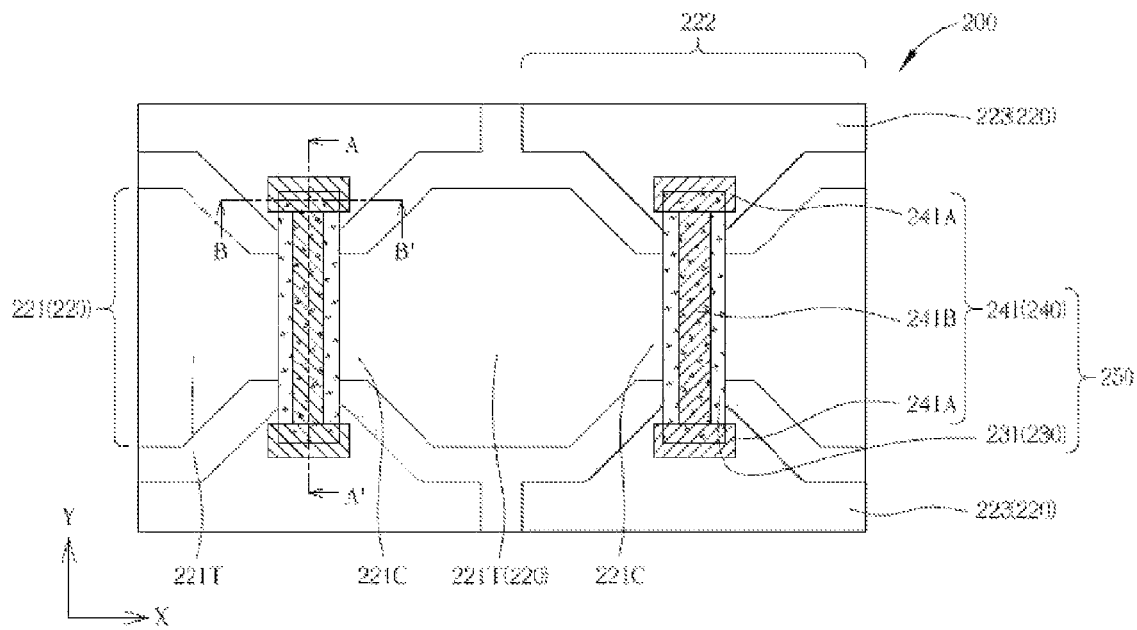
FIG. 2 shows the top-view schematic diagram of the touch panel in accordance with a first favorable embodiment of the disclosure.
Figure 3:
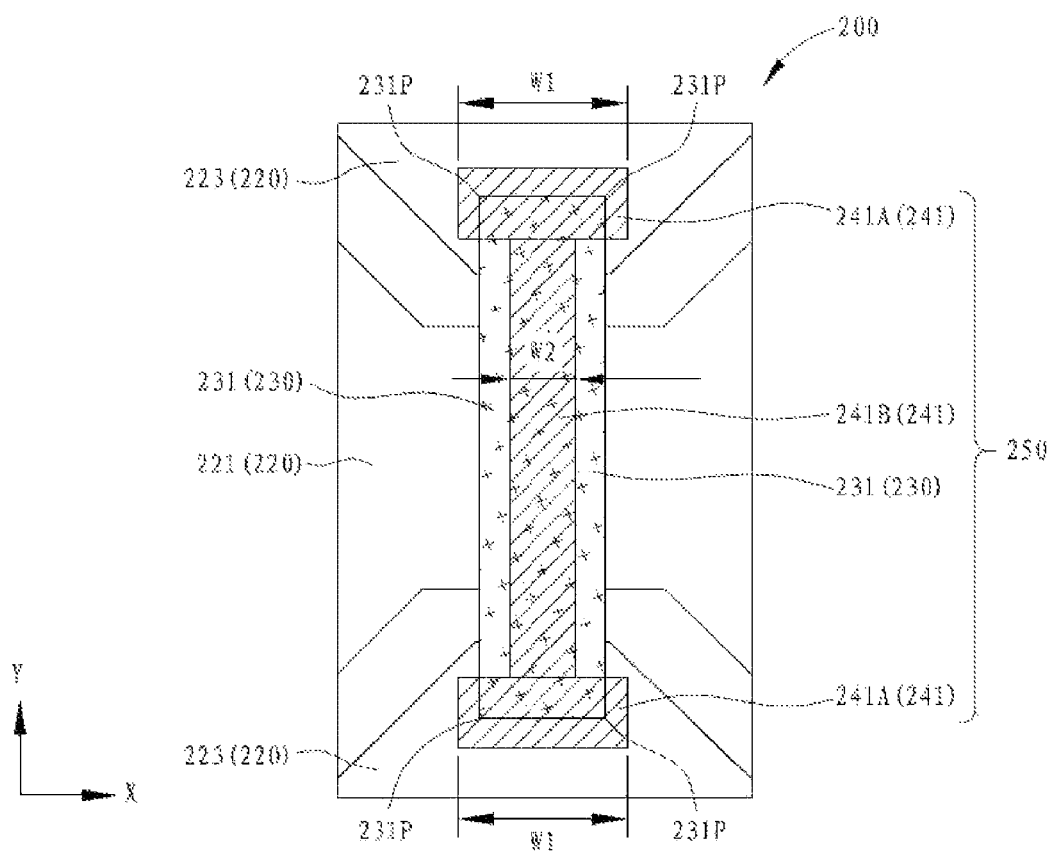
FIG. 3 shows the local-amplified schematic diagram of FIG. 2.
Figure 4:
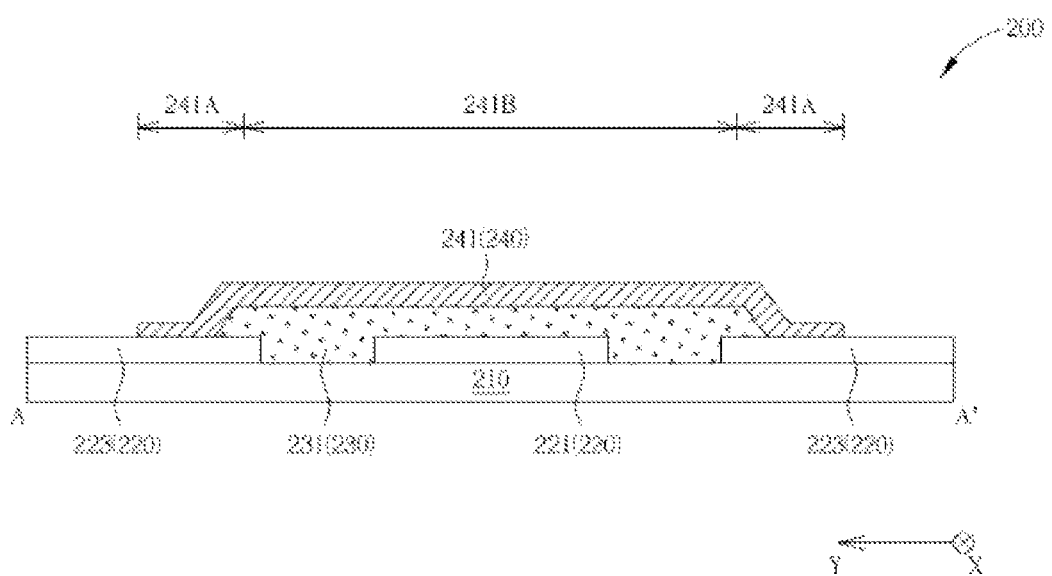
FIG. 4 shows the schematic diagram of a cross-sectional surface along the cross-sectional line A-A' in FIG. 2.
Figure 5:
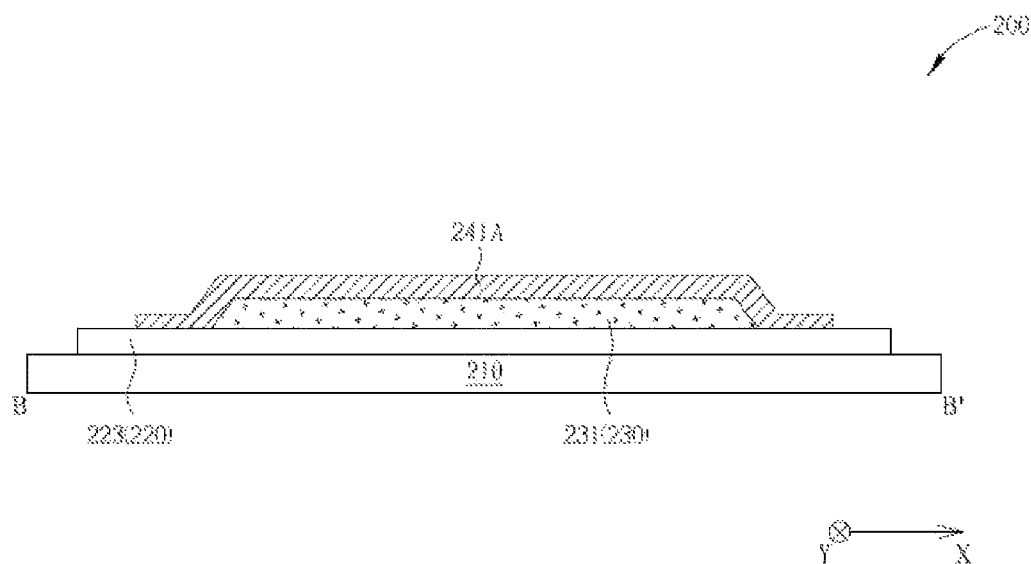
FIG. 5 shows the schematic diagram of a cross-sectional surface along the cross-sectional line B-B' in FIG. 2.

With reference to FIGS. 2~5, FIG. 2 shows the top-view schematic diagram of the touch panel in accordance with a first favorable embodiment of the disclosure. FIG. 3 shows the local-amplified schematic diagram of FIG. 2. FIG. 4 shows the schematic diagram of a cross-sectional surface along the cross-sectional line A-A' in FIG. 2. FIG. 5 shows the schematic diagram of a cross-sectional surface along the cross-sectional line B-B' in FIG. 2.

In order to make description convenient, the schemas of this disclosure are made only for indicating so as to understand the disclosure more easily, with its detailed proportions adjustable according to the requirements of the design. As shown in FIGS. 2~5, the touch panel 200 of this embodiment comprises multiple first axial electrodes 221 and multiple second axial electrodes 222. The first axial electrodes 221 extend along a first direction X, and the second axial electrodes 222 extend along a second direction Y. The second axial electrode 222 comprises a plurality of second axial conductive units 223 and at least a bridging structure 250. The bridging structure 250 connects with two adjacent second axial conductive units 223 electrically. The bridging structure 250 comprises a conductive component 241 and an insulating component 231. The insulating component is disposed between the conductive component 241 and the first axial electrode 221 to perform electrical insulation. The conductive component 241 comprises a connection portion 241B and two contact portions 241A, but the disclosure is not limited. In other embodiments, more than two contact portions can be applied if necessary. The two contact portions 241A are respectively disposed on both ends of the insulating component 231. Each contact portions 241A contacts to the corresponding second axial conductive units 223. The connection portion 241B is electrically connected with the two contact portions 241A to make two adjacent second axial conductive units 223 with a electrical connection. The length W2 of the connection portion 241B along the first direction X is less than the length W1 of the contact portions along the first direction X. In other words, the conductive component 241 of the embodiment can be regarded as in an I-shaped pattern, but the same is not limited herein. In addition, the length of the connection portion 241B along the second direction Y is preferred to be equal to the distance between the two contact portions 241A along the second direction Y, but the same is not limited herein. Moreover, the touch panel 200 of the embodiment can further comprise a substrate 210, and the first axial electrodes 221 and the second axial electrodes 222 are disposed on the substrate 210, but the same is not limited herein. In another embodiment, the conductive component 241 is disposed on the substrate 210.

In the embodiment, the first axial electrode 221 and the second axial conductive unit 223 can respectively be made of transparent conductive materials such as indium tin oxide, indium zinc oxide and aluminum zinc oxide or other suitable nontransparent conductive materials such as silver, aluminum, copper, magnesium, molybdenum or the alloy of the foregoing materials, but the same is not limited herein. The insulating component 231 can be made of inorganic materials such as silicon nitride, silicon oxide and silicon oxynitride, or organic materials such as acrylic resin or other suitable materials.

As shown in FIG. 3, each end of the insulating component 231 respectively comprises two corner portions 231P, wherein at least one corner portion 231P is covered by the contact portions 241A. For example, the coveting process can be a coating type. In the embodiment, the contact portions 241A cover two corner portions 231P, but the same is not limited herein. In addition, as shown in FIG. 2 and FIG. 3, the first axial electrode 221 comprises a plurality of the first axial conductive units 221T and a plurality of the first axial conductive wires 221C connecting to two adjacent first axial conductive units 221T electrically. The insulating components 231 of the embodiment are disposed on the first axial conductive wires 221C.

The conductive components 241 of the embodiment can be made of transparent conductive materials such as indium tin oxide, indium zinc oxide and aluminum zinc oxide or other suitable nontransparent conductive materials such as silver, aluminum, copper, magnesium, molybdenum or the alloy of the composite layers of the foregoing materials, but the same is not limited herein. In addition, the material of the connection portion 241B is preferably the same as the material of the contact portions 241A, but this disclosure is not limited herein and is visible for the necessity to made the material of the connection portion different from that of the contact portions.

As shown in FIGS. 2~5, the fabricating method for the touch panel in accordance with one favorable embodiment of this disclosure includes the following steps: firstly, forming a first axial electrode 221 and a plurality of second axial conductive units 223, wherein the foregoing method can further include forming a first conductive layer 220 and then patterning the first conductive layer 220 to form the first axial electrode 221 and the second axial conductive units 223, but the same is not limited herein. In other words, the first axial electrode 221 and the second axial conductive units 223 are preferably made of a same material so as to simplify the manufacture process, but the disclosure is not limited herein and is visible for the necessity to form the first axial electrode 221 and the second axial conductive units 223 with different materials; Secondly, forming a bridging structure 250 with the conductive component 241 and the insulating component 231. The insulating component 231 is disposed between the conductive component 241 and the first axial electrode 221 to perform electrical insulation. The method of forming the foregoing bridging structure 250 can include the following steps: First, forming an insulating layer 230 to cover the first axial electrodes 221 and the second axial conductive units 223, and patterning the insulating layer 230 to acquire insulating components 231; and then, forming a conductive component 241 upon the insulating component 231. The conductive component 241 preferably comprises at least one connection portion 241B and two contact portions 241A, but the disclosure is not limited herein and is visible for the necessity to comprise more than two contact portions. In the manufacture process of the conductive components 241, the connection portion 241B and the contact portions 241A can be acquired by patterning a second conductive layer 240 or patterning two conductive layers step by step. Therefore, the connection portion 241B and the contact portions 241A can be made up of a same material or different materials according to the demand. The two contact portions 241B are respectively disposed on both ends of the insulating component 231 and contact with the corresponding second axial conductive units 223. The connection portion 241B is electrically connected with the two contact portions 241A to make the two adjacent second axial conductive units 223 with a electrical connection. The length W2 of the connection portion 241B along the first direction X less than the lengths W1 of the contact portions 241A along the first direction X. In other words, the bridging structure 241 of the embodiment can be regarded as in I-shaped pattern, but the same is not limited herein. In addition, the second axial conductive units 223 and the bridging structures 250 constitute the second axial electrodes 222, but the same is not limited herein.

The following content is aimed at making descriptions for different embodiments of the touch panel in the disclosure. In order to simplify the descriptions, the following content primarily makes detailed illustration for different points among the embodiments, and not repeats the same points. In addition, the same components in embodiments of the disclosure are marked with the same markers to facilitate mutual contrasts among the embodiments.

Figure 6:
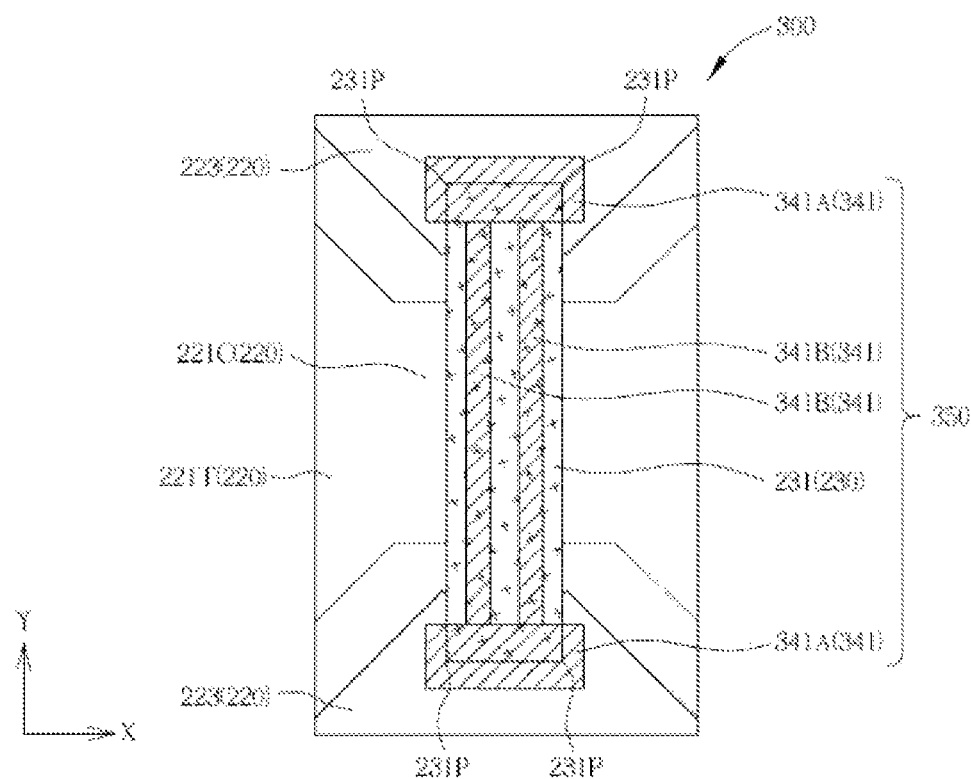
FIG. 6 shows the schematic diagram of the touch panel in accordance with a second favorable embodiment of the disclosure.

FIG. 6 shows the schematic diagram of the touch panel in accordance with a second favorable embodiment of the disclosure. As shown in FIG. 6, the touch panel 300 of the embodiment comprises a bridging structure 350 with a conductive component 341 and an insulating component 231. The difference between this embodiment and the touch panel 200 of the foregoing first favorable embodiment is that the conductive component 341 of this embodiment comprises two contact portions 341A and two connection portions 341B. In the embodiment, the two connection portions 341B connect to the two contact portions 344A to make the two adjacent second axial conductive units 223 with a electrical connection. Except to the two connection portions 341B of the touch panel 300, the setting of the components and the properties of materials in the embodiment are similar to those of the touch panel 200 of the foregoing first favorable embodiment, which will not be repeated herein.

Figure 7:
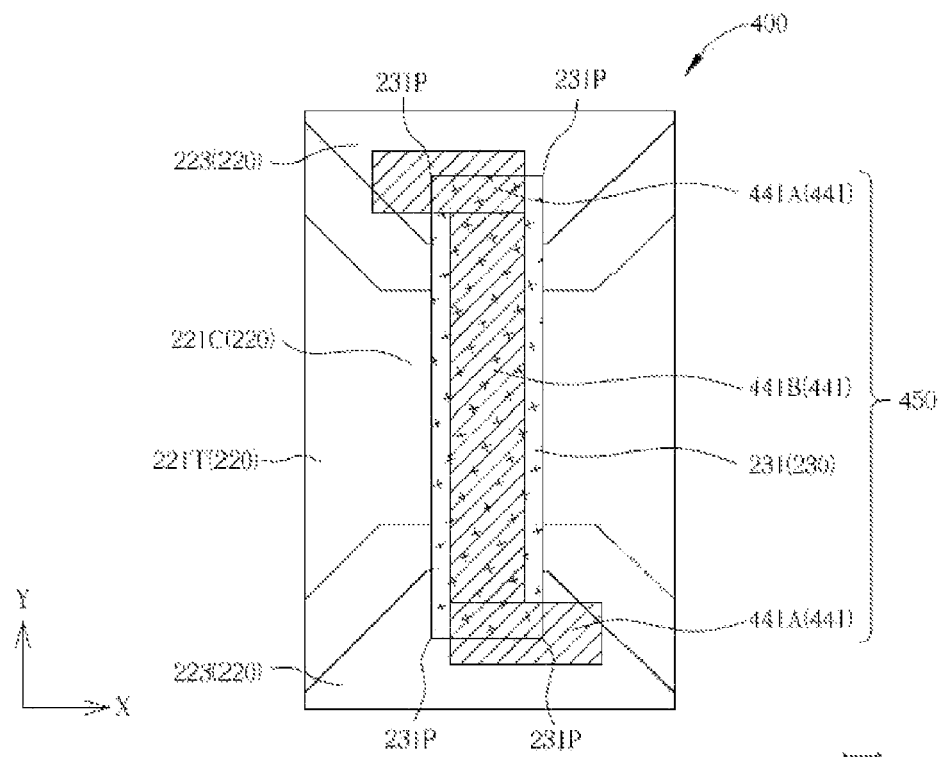
FIG. 7 shows the schematic diagram of the touch panel in accordance with a third favorable embodiment of the disclosure.

FIG. 7 shows the schematic diagram of the touch panel in accordance with a third favorable embodiment of the disclosure. As shown in FIG. 7, the touch panel 400 comprises a bridging structure 450 with a conductive component 441 and an insulating component 231. The differences between this embodiment and the touch panel 200 of the foregoing first favorable embodiment are that the conductive component 441 comprises two contact portions 441A and a connection portion 441B, and that the contact portions 441A only covers one corner portion 231P. Except to that the contact portions 441A only cover one corner portion 231P of the touch panel 400, the setting of the components and the properties of materials in the embodiment are similar to those of the touch panel 200 of the foregoing first favorable embodiment, which will not be repeated herein.

Figure 8:
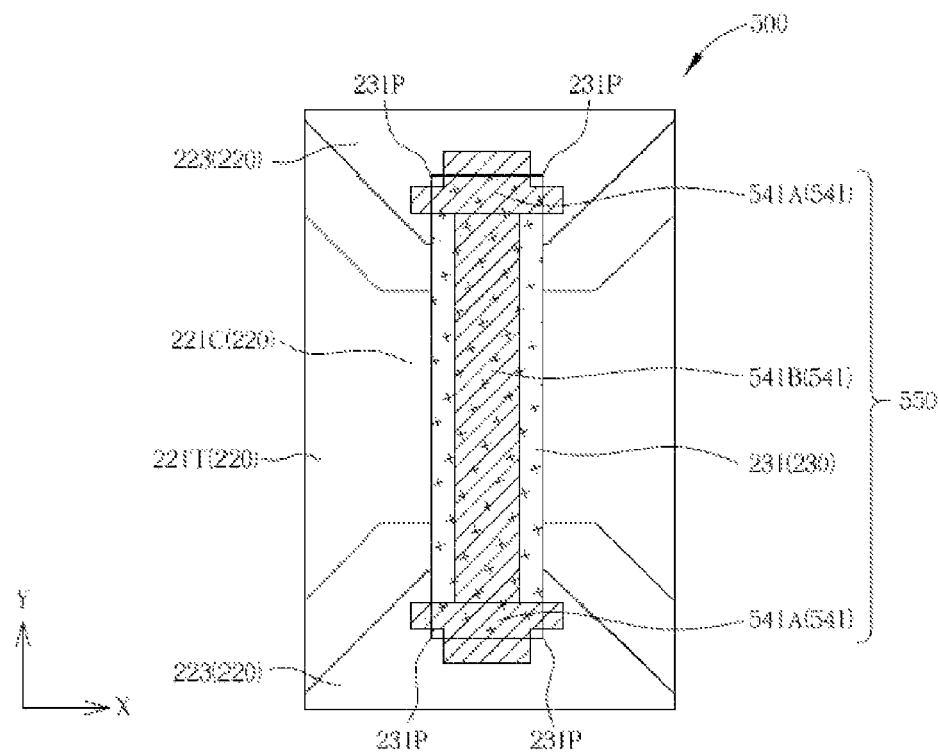
FIG. 8 shows the schematic diagram of the touch panel in accordance with a fourth favorable embodiment of the disclosure.

FIG. 8 shows the schematic diagram of the touch panel in accordance with a fourth favorable embodiment of the disclosure. As shown in FIG. 8, the touch panel 500 comprises a bridging structure 550 with a conductive component 541 and an insulating component 231. The differences between this embodiment and the touch panel 200 of the foregoing first favorable embodiment are that the conductive component 541 comprises two contact portions 541A and a connection portion 541B, and that the two contact portions 541A are respectively lapped to both ends of the insulating component 231 without covering any corner portion 231P. In other words, the contact portion 541A is in a T-shaped pattern, and is disposed on one end of the insulating component 231 without covering any corner portion 231P. Except to the contact portions 541A of the touch panel 500, the setting of the components and the properties of adopted materials in the embodiment are similar to those of the touch panel 200 of the foregoing first favorable embodiment, which will not be repeated herein.

Figure 9:
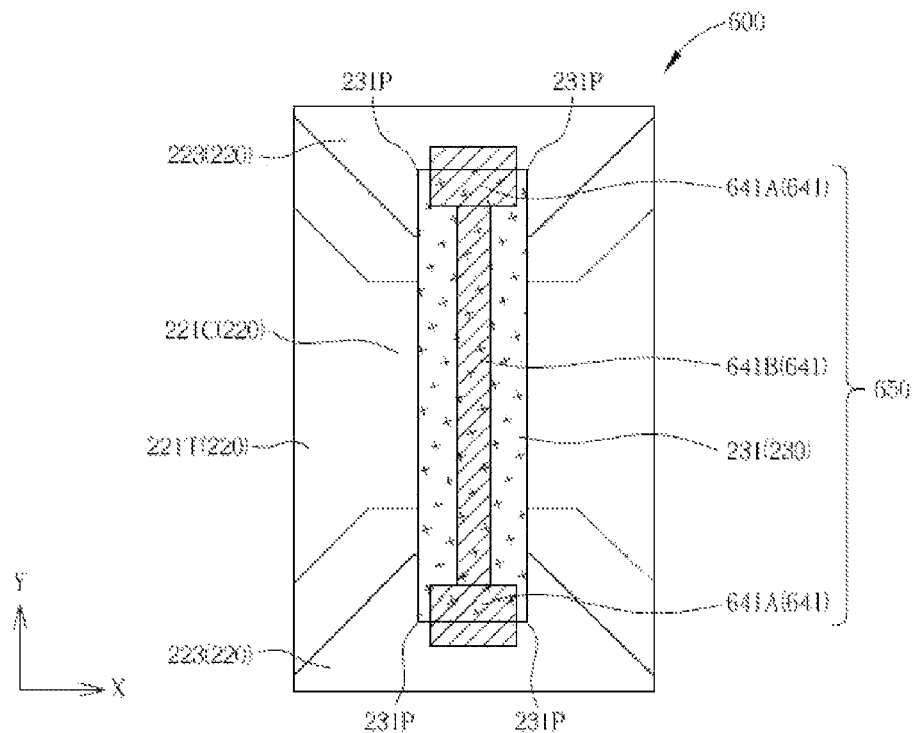
FIG. 9 shows the schematic diagram of the touch panel in accordance with a fifth favorable embodiment of the disclosure.

FIG. 9 shows the schematic diagram of the touch panel in accordance with a fifth favorable embodiment of the disclosure. As shown in FIG. 9, the touch panel 600 comprises a bridging structure 650 with a conductive component 641 and an insulating component 231. The differences between this embodiment and the touch panel 500 of the foregoing fourth favorable embodiment are that the conductive component 641 comprises two contact portions 641A and a connection portion 641B, and that the contact portions 641A are in a rectangular form, and that the contact portions 641A are respectively lapped to both ends of the insulating component 231 without covering any corner portion 231P. In other words, the length of each contact portion 641A along, the first direction X is less than the distance between two corner portions 231P located at one end of the insulating component 231, and a projection of the insulating component 231 on the contact portions 641A covers the contact portions 641A in the first direction X. Except to the contact portions 641A of the touch panel 600, the setting of the components and the properties of materials in the embodiment are similar to those of the touch panel 200 of the foregoing first favorable embodiment, which will not be repeated herein.

Figure 10:
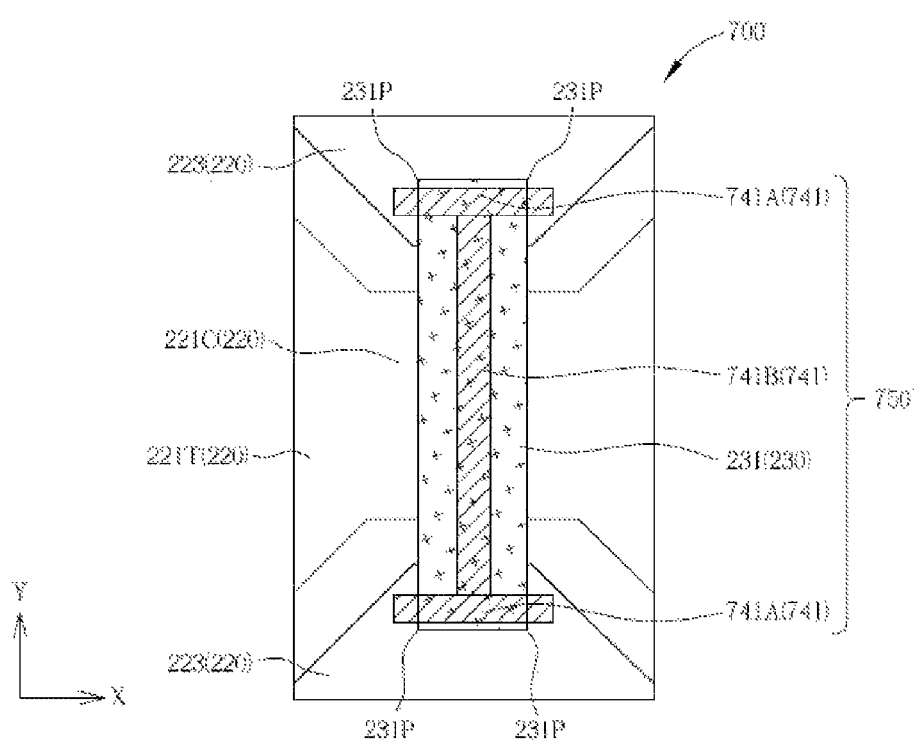
FIG. 10 shows the schematic diagram of the touch panel in accordance with a sixth favorable embodiment of the disclosure.

FIG. 10 shows the schematic diagram of the touch panel in accordance with a sixth favorable embodiment of the disclosure. As shown in FIG. 10, the touch panel 700 comprises a bridging structure with a conductive component 741 and an insulating component 231. The difference between this embodiment and the touch panel 500 of the foregoing fifth favorable embodiment are that the conductive component 741 comprises two contact portions 741A and a connection portion 741B, and that the contact portions 741A stretch across one end of the insulating component without covering any corner portion 231P. In other words, the length of each contact portion 741A along the first direction X is larger than the distance between two corner portions 231P located at one end of the insulating component 231, and a projection of the contact portion 741A on the insulating component 231 covers the insulating component 231 in the first direction. The length of the projection of contact portion along the second direction Y is less than the length of the insulating component 231, and a projection of the insulating component 231 on the contact portions 741A covers the contact portions 741A in the second direction Y. Except to the contact portions 741A of the touch panel 700, the setting of the components and the properties of materials in the embodiment are similar to those of the touch panel 200 of the foregoing first favorable embodiment, which will not be repeated herein.

Figure 11:
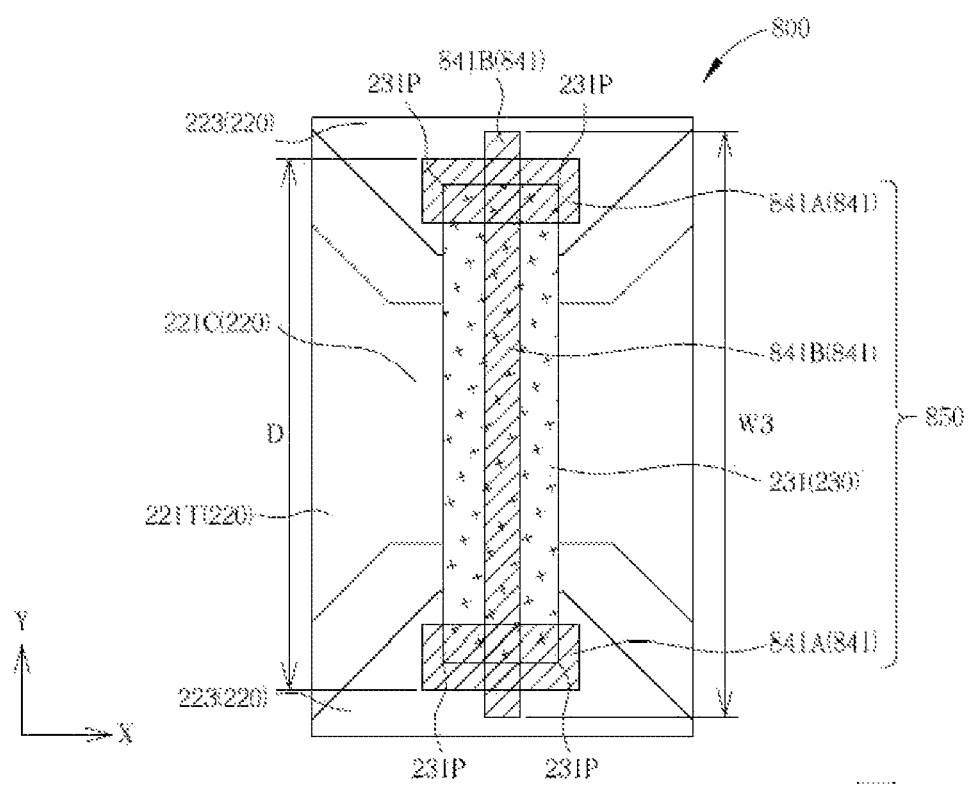
FIG. 11 shows the schematic diagram of the touch panel in accordance with a seventh favorable embodiment of the disclosure.

FIG. 11 Shows the schematic diagram of the touch panel in accordance with a seventh favorable embodiment of the disclosure. As shown in FIG. 11, the touch panel 800 comprises a bridging structure 850 with a conductive component 841 and an insulating component 231. The difference between this embodiment and the touch panel 200 of the foregoing first favorable embodiment are that the conductive component 841 comprises two contact portions 841A and a connection portion 841B, and that the length W3 of the connection portion 841B along the second direction Y is larger than the distance D between the two external sides of the two contact portions 844A along the second direction Y. Except to the connection portion 841B of the touch panel 800, the setting of the components and the properties of materials in the embodiment are similar to those of the touch panel 200 of the foregoing first favorable embodiment, which will not be repeated herein.

Figure 12:
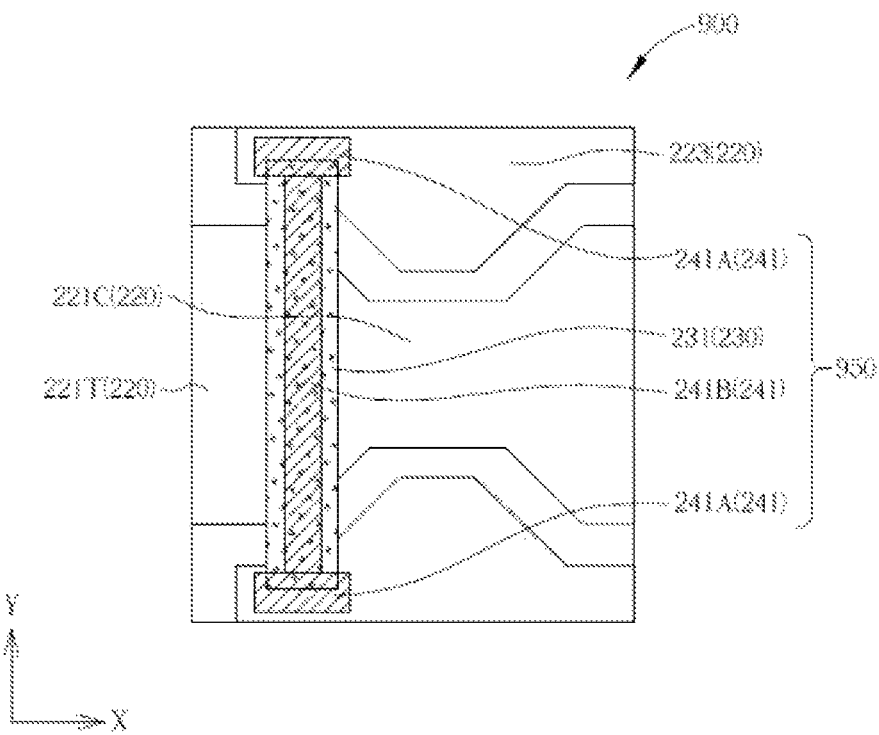
FIG. 12 shows the schematic diagram of the touch panel in accordance with an eighth favorable embodiment of the disclosure.

FIG. 12 shows the schematic diagram of the touch panel in accordance with an eighth favorable embodiment of the disclosure. As shown in FIG. 12, the touch panel 900 comprises a bridging structure 950 with a conductive component 241 and an insulating component 231. The difference between this embodiment and the touch panel 200 of the foregoing first favorable embodiment is that the bridging structure 950 is disposed on the first axial conductive units 221T. In other words, the insulating component 231 of the bridging structure 950 is disposed on the first axial conductive units 221T. Except to the setting of the bridging structure 950 of the touch panel 900, the setting of the components and the properties of materials in the embodiment are similar to those of the touch panel 200 of the foregoing first favorable embodiment, which will not be repeated herein.

From the above-mentioned, the underlying principle of the touch panel in this disclosure is that a conductive component comprises two contact portions with wider breadth and a connection portion with relative narrow breadth, wherein the conductive component connects with two adjacent second-axial conductive units electrically. The contact area between the bridging structure and the second-axial conductive unit increases, and this reduces the influence described in prior art about the fracture of the bridging line. Then, the stability of the touch panel in signal is upgrade.

While certain embodiments have been shown and described, modifications and substitutions may be made thereto without departing from the spirit and scope of the disclosure. Therefore, it is to be understood that the present disclosure has been described by way of illustration and not limitations.

What is claimed is:

1. A touch panel, comprising:
a plurality of first axial electrodes, extending along a first direction;
a plurality of second axial electrodes, extending along a second direction, wherein each second axial electrode comprises a plurality of second axial conductive units and at least a bridging structure connecting between two adjacent second axial conductive units electrically;
wherein the bridging structure comprises a conductive component and an insulating component, the insulating component being disposed between the conductive component and the first axial electrode to perform electrical insulation;
wherein the conductive component comprises at least one connection portion and two contact portions, the two contact portions being respectively disposed on both ends of the insulating component and contacting their corresponding second axial conductive units, and the connection portion being electrically connected with the two contact portions to make the two adjacent second axial conductive units connect electrically;
wherein the length of the connection portion along the first direction is less than the length of each contact portion along the first direction;
wherein each of the insulating component respectively comprises two corner portions, at least on corner portion being covered by the contact portion.

2. The touch panel of claim 1, wherein the first axial electrode comprises a plurality of first axial conductive units and a plurality of first axial conductive wires connecting to two adjacent first axial conductive units electrically.

3. The touch panel of claim 2, wherein the insulating component is disposed on the first axial conductive wire.

4. The touch panel of claim 2, wherein the insulating component is disposed on at least one first axial inductive unit.

5. The touch panel of claim 1, wherein the length of the connection portion along the second direction is equal to or larger than the distance between the two internal sides of the two contact portions along the second direction.

6. The touch panel of claim 1, wherein the touch panel further comprises a substrate, and the first axial electrodes and the second axial conductive units are disposed on the substrate.

7. The touch panel of claim 1, wherein the touch panel further comprises a substrate, and the conductive component is disposed on the substrate.

8. The touch panel of claim 1, wherein the material of the connection portion is the same as the material of the contact portions.

9. The touch panel of claim 1, wherein the material of the connection portion is different from the material of the contact portions.

10. A touch panel, comprising:
a plurality of first axial electrodes, extending along a first direction;
a plurality of second axial electrodes, extending along a second direction, wherein each second axial electrode comprises a plurality of second axial conductive units and at least a bridging structure connecting between two adjacent second axial conductive units electrically;
wherein the bridging structure comprises a conductive component and an insulating component, the insulating component being disposed between the conductive component and the first axial electrode to perform electrical insulation;
wherein the conductive component comprises at least one connection portion and two contact portions, the two contact portions being respectively disposed on both ends of the insulating component and contacting their corresponding second axial conductive units, and the connection portion being electrically connected with the two contact portions to make the two adjacent second axial conductive units connect electrically;
wherein the length of the connection portion along the first direction is less than the length of each contact portion along the first direction;
wherein each end of the insulating component respectively comprises two corner portions, the two contact portions being respectively lapped to both ends of the insulating component, without covering each corner portion.

11. The touch panel of claim 10, wherein the length of each contact portion along the first direction is less than the distance between two corner portions located at one end of the insulating component, and a projection of the insulating component on the contact portions covers the contact portions in the first direction.

12. The touch panel of claim 10, wherein the length of each contact portion along the first direction is larger than the distance between two corner portions located at one end of the insulating component, and a projection of the contact portion on the insulating component covers the insulating component in the first direction; the length of the projection of contact portion along the second direction is less than the length of the insulating component along the second direction, and a projection of the insulating component on the contact portions covers the contact portions along the second direction.

13. The touch panel of claim 10, wherein the first axial electrode comprises a plurality of first axial conductive units and a plurality of first axial conductive wires connecting to two adjacent first axial conductive units electrically.

14. The touch panel of claim 13, wherein the insulating component is disposed on the first axial conductive wire.

15. The touch panel of claim 13, wherein the insulating component is disposed on at least one first axial inductive unit.

16. The touch panel of claim 10, wherein the length of the connection portion along the second direction is equal to or larger than the distance between the two internal sides of the two contact portions along the second direction.

17. The touch panel of claim 10, wherein the touch panel further comprises a substrate, and the first axial electrodes and the second axial conductive units are disposed on the substrate.

18. The touch panel of claim 10, wherein the touch panel further comprises a substrate, and the conductive component is disposed on the substrate.

19. The touch panel of claim 10, wherein the material of the connection portion is the same as the material of the contact portions.

20. The touch panel of claim 10, wherein the material of the connection portion is different from the material of the contact portions.

* * * * *